United States Patent [19]

Iizuka et al.

[11] Patent Number: 5,145,649
[45] Date of Patent: Sep. 8, 1992

[54] APPARATUS FOR CLEANING AN OPTICAL ELEMENT FOR USE WITH A RADIATION BEAM

[75] Inventors: Takashi Iizuka, Atsugi; Yasuaki Fukuda, Hadano; Masami Hayashida; Masahito Niibe, both of Atsugi, all of Japan

[73] Assignee: Canon Kabushiki Kaisha, Tokyo, Japan

[21] Appl. No.: 592,302

[22] Filed: Oct. 2, 1990

[30] Foreign Application Priority Data

Oct. 3, 1989 [JP] Japan .................................. 1-257079

[51] Int. Cl.$^5$ ............................................. B08B 7/00
[52] U.S. Cl. .................... 422/129; 422/186.3; 422/186; 134/1; 359/509
[58] Field of Search ............ 422/129, 187, 186, 186.3, 422/907; 204/157.15, 157.4, 157.47, 180.6; 134/1; 359/509

[56] References Cited

U.S. PATENT DOCUMENTS

| | | | |
|---|---|---|---|
| 4,555,303 | 11/1985 | Legge et al. | 156/643 |
| 4,642,171 | 2/1987 | Sekine et al. | 422/186.3 |
| 4,816,113 | 3/1989 | Yamazaki | 156/643 |
| 4,976,930 | 12/1990 | Kishida et al. | 422/186.3 |
| 5,024,968 | 6/1991 | Engelsberg | 437/173 |

FOREIGN PATENT DOCUMENTS 8702603  5/1987  PCT Int'l Appl. .

OTHER PUBLICATIONS

Patent Abstracts of Japan, vol. 9, No. 283 for Japanese Patent Document No. 60-129136 (Jul. 10, 1985), Nov. 9, 1985.
Patent Abstracts of Japan, vol. 9, No. 125 for Japanese Patent Document No. 60-12128 (Jan. 22, 1985), May 30, 1985.
Koide, et al., "Resuscitation of carbon-contaminated mirrors and gratings by oxygen-discharge cleaning," Applied Optics, vol. 26, No. 18, pp. 3884–3894, Sep. 15, 1987.

Primary Examiner—Robert J. Warden
Assistant Examiner—T. A. Trembley
Attorney, Agent, or Firm—Fitzpatrick, Cella, Harper & Scinto

[57] ABSTRACT

A method and apparatus for removing unclear matter on an optical element used with a radiation beam is disclosed. A filter is used to introduce light of a desired wavelength into a chamber in which the optical element is accommodated; a gas supplying device is used to supply a reactive gas which is reactable with the unclear matter on the surface of the optical element; and a vacuum-evacuating device is used to vacuum-evacuate the inside of the chamber.

11 Claims, 1 Drawing Sheet

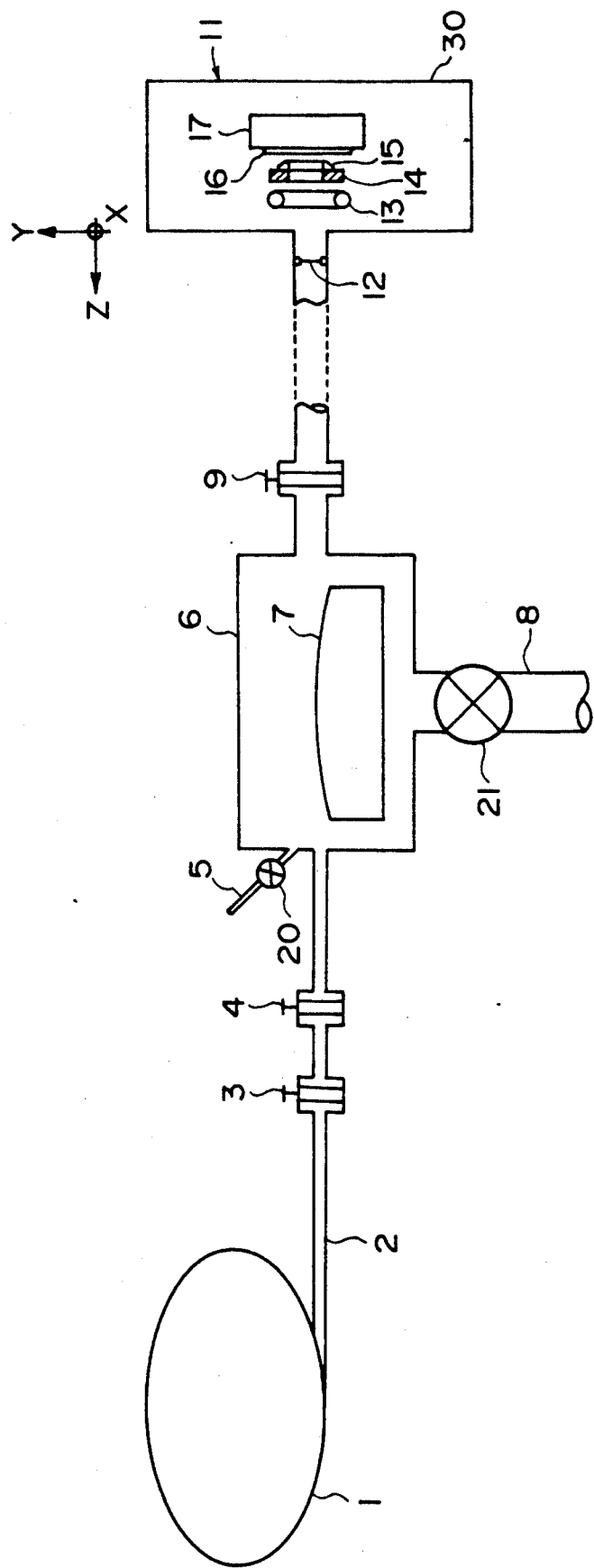

APPARATUS FOR CLEANING AN OPTICAL ELEMENT FOR USE WITH A RADIATION BEAM

FIELD OF THE INVENTION AND RELATED ART

This invention relates to a method and apparatus for removing unclear matter on an optical element for use with a radiation beam such as a synchrotron orbit radiation beam, for example.

If an optical element is used with a radiation beam for a long period, carbon (C), for example, is deposited onto such portion of the surface of the optical element having been irradiated with the radiation beam. This raises a problem of deterioration of the property of the optical element. In the past, experiments were made to remove deposited carbon by using oxygen plasma ("Applied Optics", Vol. 26, No. 18/15, Sep. 1987).

SUMMARY OF THE INVENTION

However, because of the use of oxygen plasma, the proposed method of removing unclear matter involves the following inconveniences. That is, like the addition of an electrode device for producing plasma, it needs modification of a chamber or provision of additional devices. Also, since the optical element as a whole is exposed to the plasma, there is a possibility that a non-contaminated portion is damaged.

It is accordingly an object of the present invention to provide a method and apparatus for removing unclear matter with a simple process or structure, by which an optical element is less damaged.

This object can be achieved by removing any unclear matter on the surface of an optical element, by means of photochemical etching.

The structure of the device for photochemical etching is quite simple, and only the addition of a gas discharging system to an optical element chamber as well as a gas inlet port and a light transmitting filter at the radiation beam input side, is necessary.

The mechanism of reaction is such that: on an occasion when oxygen, for example, is used as a reactive gas, light of a wavelength shorter than 2537 angstroms is projected to the oxygen, by which ozone is produced. This absorbs light shorter than 8500 angstroms, by which molecule oxygen and atom oxygen are produced. Since the atom oxygen is active, it reacts with carbon which is the component of the unclear matter on the surface of the optical element, to gasify it. The resultant gas is then discharged.

With this mechanism, no physical force is applied to the surface of the optical element and, therefore, there is no possibility of damaging of the element.

These and other objects, features and advantages of the present invention will become more apparent upon a consideration of the following description of the preferred embodiments of the present invention taken in conjunction with the accompanying drawing.

BRIEF DESCRIPTION OF THE DRAWING

The attached drawing is a schematic representation, showing the basic structure of a cleaning device of the present invention when it is used in an exposure system.

DESCRIPTION OF THE PREFERRED EMBODIMENTS

Embodiment 1

In this embodiment, in the basic structure of the present invention as illustrated in the drawing, as an optical element 7 for use with a radiation beam, a grazing incidence mirror made of silicon dioxide ($SiO_2$) coated with gold (Au) is used.

A radiation beam emitted by an electron accumulation ring 1 is projected to the grazing incidence mirror 7 through a beam line 2. For this projection, the inside of a chamber 6 in which the mirror 7 is placed is evacuated through an evacuation line 8 and the inside vacuum is maintained not greater than $10^{-8}$ Torr, for example, about $5 \times 10^{-9}$ Torr.

If the radiation beam from the electron accumulation ring 1 is projected continuously to the mirror 7 for a long time period, impurity mainly consisting of carbon (C) is deposited on the reflection surface of the mirror 7. According to simulated measurement of the reflectivity, assuming that the mirror is irradiated with the radiation beam for about one year, the mirror surface reflectivity decreases, on the average, to about 70-80% of its original reflectivity. Particularly, in the wavelength range near 44 angstroms which corresponds to the wavelength at the absorption edge of the carbon, the reflectivity decreases to about 30%. To such reflectivity-decreased mirror 7, the surface cleaning of the present invention may be conducted, by which the original reflectivity can be restored. This will be explained below in greater detail.

First, a protection valve 3 and a transmission filter 4 provided along the beam line 2 are closed by using a linear motion coupler, and the transmission filter 4 is positioned in the beam line 2. Then, a valve 9, which is provided at a side of the mirror chamber 6 facing an exposure apparatus 11, is closed and, thereafter, oxygen gas is introduced into the mirror chamber 6 through a gas inlet 5. The protection valve 3 is provided to avoid breakage of the filter 4 due to differential pressure to be produced between the beam line 2 and the mirror chamber 6 as the oxygen gas is introduced from the gas inlet 5, which breakage has a considerable effect on the electron accumulation ring (synchrotron) 1 as a whole. Thus, essentially it may be omitted. However, in consideration of safety, use of the protection valve is desirable.

Also, in order to prevent a possibility that a large force is applied at any moment to the transmission filter 4 as the oxygen gas is introduced, it is desirable to provide a needle valve 20 or the like at the gas inlet 5 such that the gas is introduced slowly. The evacuation line 8 is coupled to a vacuum source (not shown), and a conductance valve 21 or the like effective to reduce the conductance is disposed at an end portion of the evacuation line 8, to allow slow leakage. Under such slow leakage, the inside pressure of the mirror chamber 6 is maintained at a few Torrs, for example, about 2 Torrs. After this, the protection valve 3 is opened, whereby the radiation beam from the electron accumulation ring 1 is projected to the transmission filter 4. Thus, the light transmitted through this filter 4 is projected to the reflection surface of the mirror 7. Here, the transmission filter 4 may be made of silica ($SiO_2$) of a thickness of 0.5 mm. On that occasion, light containing a wavelength component of 2537 angstroms and having energy sufficient for accelerating the reaction of oxygen introduced into the mirror chamber 6 with carbon deposited on the reflection surface of the mirror 7, can be supplied from the filter 4 to the mirror 7.

Leaving this condition for about fifteen (15) hours, the cleaning process may be completed. According to simulated measurement, the reflectivity of the mirror 7 can be restored to a level not lower than 95% of its original reflectivity. The exposure apparatus 11 in this example is used to print a pattern of a mask 15 on a semiconductor wafer 16 in a step-and-repeat manner, by using the radiation beam (X-rays) emanating from the electron accumulation ring 1 and reflected by the mirror 7. In the attached drawing, denoted at 12 is a beryllium film (beryllium window) for isolating a high vacuum at the mirror chamber 6 side from a reduced-pressure helium gas ambience at the exposure apparatus 11 side, in the operation of the exposure apparatus 11. Denoted at 13 is a shutter for controlling the exposure (the amount of exposure) of the mask 15 and the wafer 16 with the radiation beam from the mirror 7. Denoted at 14 is a mask holder for holding the mask 15 at the illustrated exposure position. Denoted at 17 is a wafer stage for holding the wafer 16 and being movable in the y-axis (vertical) and x-axis (horizontal) directions, for step-and-repeat exposures of the wafer 16. These components are accommodated in an exposure chamber 30, and they are surrounded by the reduced-pressure helium gas ambience.

Embodiment 2

In this embodiment, in the basic structure of the present invention illustrated in the attached drawing, as an optical element 7 for use with a radiation beam, a diffraction grating (twelve hundred lines per milimeter) made of silica ($SiO_2$) is used.

A radiation beam emitted by an electron accumulation ring 1 is projected to the diffraction grating 7 through the beam line 2. In this projection, the inside of a chamber 6 in which the diffraction grating is accommodated, is maintained at a vacuum of not greater than $10^{-8}$ Torr, for example, $5 \times 10^{-9}$ Torr.

According to simulation, if the radiation beam is projected to the diffraction grating for about seven months, the intensity of first-order diffraction light of the light inputted to the diffraction grating at an angle of 20 degrees with respect to a normal to the diffraction grating, decreases to about 10% of that attainable before irradiation with the radiation beam.

To such a diffraction grating, a similar cleaning process as in Embodiment 1 may be conducted. In this embodiment, the transmission filter may be made of silica ($SiO_2$) of a thickness of 1 mm, while the oxygen gas pressure may be at 5 Torr. According to the simulation, by projecting the filter-transmitted light to the surface of the diffraction grating for twelve (12) hours, the diffraction efficiency can be restored to a level of 90% of the original efficiency.

Embodiment 3

In this embodiment, as an optical element for use with a radiation beam, a grazing incidence mirror made of silica ($SiO_2$) and coated with gold, is used.

The grazing incidence mirror 7 is disposed in a chamber 6 the inside of which is maintained at a pressure not greater than $10^{-8}$ Torr, for example, about $5 \times 10^{-9}$ Torr. According to simulated measurement of reflectivity, if the mirror surface is irradiated with the radiation beam from the electron accumulation ring 1 for about one year, the reflectivity decreases, on the average, to about 80% of the original reflectivity. In this embodiment, by using a heater (not shown), such a reflectivity-reduced mirror 7 is heated so that its surface temperature rises to 200° C., and then the cleaning process is conducted in a similar manner as in Embodiment 1. In the present embodiment, the oxygen pressure in the chamber 6 may be held at a few Torrs, for example, 2 Torrs. Also, the transmission filter 4 may be made of silicon nitride ($Si_3N_4$) of a thickness of 0.2 micron formed by backetching.

Leaving this condition for twelve hours, the cleaning process may be completed. According to the simulation, the reflectivity can be restored to a level not lower than 95% (average) of the original reflectivity.

Embodiment 4

In this embodiment, as an optical element for use with a radiation beam, a grazing incidence mirror made of silica ($SiO_2$) coated with platinum (Pt) is used.

The grazing incidence mirror 7 is disposed in a chamber 6 the inside of which is maintained at a pressure not greater than $10^{-8}$ Torr, for example, about $5 \times 10^{-9}$ Torr. According to simulated measurement of reflectivity, if the grazing incidence mirror is irradiated with the radiation beam from the electron acumulation ring 1 for about one year, the reflectivity decreases on the average to about 75% of the original reflectivity of the mirror. To such a reflectivity-decreased mirror, a cleaning process of the present invention may be conducted. In this embodiment, the pressure in the chamber 6 may be a few Torrs, for example, 2 Torrs. Also, the transmission filter may be provided by a silica plate having a thickness of 1 mm. In this embodiment, ozone prepared separately is introduce into the chamber 6, and the cleaning process is carried out.

Leaving this condition for twelve hours, the cleaning process may be complated. According to the simulated measurement of the reflectivity, the reflectivity can be restored, on the average, to 95% or more of the original reflectivity.

As described hereinbefore, with the method and apparatus for cleaning an optical element for use with a radiation beam, it is possible to remove carbon deposited on the optical element, which leads to deterioration of the performance of the optical element, with a simple structure and without damaging the optical element. Thus, it is possible to restore the property of the optical element.

Further, in accordance with the present invention, the cleaning process for removing carbon or the like can be executed within a vacuum ambience, and, thus, without exposure to the atmosphere. Also, the cleaning process can be executed without demounting the optical element. Thusk, it is possible to reduce the time necessary for demounting/mountingg and for aligning the optical element. Further, the device structure as well as added components are simple. Also, there is no possibility of damaging the surface (coating) of the optical element. Consequently, the present invention is significantly contributable to easy maintenance of an optical element to be used with a radiation beam, to which attention has not been paid. This ensures effective utilization of the synchrotron radiation beam in terms of function and also of time.

While the invention has been described with reference to the structures disclosed herein, it is not confined to the details set forth and this application is intended to cover such modifications or changes as may come within the purposes of the improvements or the scope of the following claims.

What is claimed is:

1. A projecting device for projecting a radiation beam to an article along a projection path, said device comprising:
   a holder for holding an article;
   an optical element disposed before said holder along a radiation beam projection path;
   a chamber for accommodating said optical element therein;
   gas supplying means for supplying, into said chamber, gas effective to remove impurities adhered to said optical element;
   vacuum evacuating means for evacuating said chamber; and valve means disposed between said optical element and said holder along the radiation beam projection path,
   wherein said valve means is opened when a radiation beam is projected to the optical element and to the article, and is closed when the gas is supplied into said chamber.

2. A device according to claim 1, wherein said vacuum evacuating means comprises means for maintaining a predetermined pressure in said chamber when the gas is supplied into said chamber.

3. A device according to claim 1, further comprising a filter, being disposed before said optical element along the radiation beam projection path, as the gas is supplied into said chamber.

4. A device according to claim 3, wherein the radiation beam is projected through said filter, as the gas is supplied into said chamber.

5. A device according to claim 4, wherein said filter is made of silica and the gas comprises one of oxygen and ozone.

6. A projecting device for projecting a radiation beam to an article along a projection path, said device comprising:
   a holdder for holding an article;
   an optical element disposed before said holder along a radiation beam projection path;
   a chamber for accommodating said optical element therein;
   gas supplying means for supplying, into said chamber, gas comprising one of oxygen and ozone;
   vacuum evacuating means for evacuating said chamber; and
   valve means disposed between said optical element and said holder along the radiation beam projection path,
   wherein said valve means is opened when a radiation beam is projected to said optical element and to the article, and is closed when the gas is supplied into said chamber.

7. A device according to claim 6, wherein said vacuum evacuating means comprises means for maintaining a predetermined pressure in said chamber when the gas is supplied into said chamber.

8. A device according to claim 6, further comprising a filter, being disposed before said optical element along the radiation beam projection path, as the gas is supplied into said chamber.

9. A device according to claim 8, wherein the radiation beam is projected through said filter, as the gas is supplied into said chamber.

10. A projecting device for projecting a radiation beam to an article along a pojection path, said device comprising:
    a holder for holding an article;
    an optical element disposed before said holder along a radiation beam projection path;
    a chamber for accommodating said optical element therein; and
    gas supplying means for supplying, into said chamber, gas effective to remove impurities adhered to said optical element, said gas supplying means supplying the gas when a radiation beam is not projected to the article.

11. A device according to claim 10, wherein the gas supplied by said supplying means reacts with impurities adhered to the article in response to projection of the radiation beam to said optical element.

* * * * *

UNITED STATES PATENT AND TRADEMARK OFFICE
CERTIFICATE OF CORRECTION

PATENT NO. : 5,145,649

DATED : September 8, 1992

INVENTOR(S) : Takashi Iizuka, et al.

It is certified that error appears in the above-identified patent and that said Letters Patent is hereby corrected as shown below:

COLUMN 1

Line 57, "of" should be deleted.

COLUMN 4

Line 35, "introduce" should read --introduced--;
    Line 38, "complated." should read --completed.--;
    Line 55, "Thusk," should read --Thus,--; and
    Line 56, "mountingg" should read --mounting--.

COLUMN 5

Line 18, "ber; and value means disposed between said optical" should read:
    --ber; and
        valve means disposed between said optical--; and
    Line 44, "holdder" should read --holder--.

UNITED STATES PATENT AND TRADEMARK OFFICE
CERTIFICATE OF CORRECTION

PATENT NO. : 5,145,649
DATED : September 8, 1992
INVENTOR(S) : Takashi Iizuka, et al.

It is certified that error appears in the above-identified patent and that said Letters Patent is hereby corrected as shown below:

COLUMN 6

Line 28, "pojection" should read --projection--.

Signed and Sealed this

Fifth Day of October, 1993

Attest:

BRUCE LEHMAN

Attesting Officer    Commissioner of Patents and Trademarks